(12) United States Patent
Woo et al.

(10) Patent No.: US 10,588,250 B2
(45) Date of Patent: Mar. 10, 2020

(54) MAGNETIC SHIELDING TAPE FOR CABLE AND METHOD FOR MANUFACTURING THEREOF

(71) Applicant: 3M INNOVATIVE PROPERTIES COMPANY, St. Paul, MN (US)

(72) Inventors: Seong-Woo Woo, Seoul (KR); Jinbae Kim, Gyounggoi-do (KR); Jung-Ju Suh, Seoul (KR)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 16/090,755

(22) PCT Filed: Mar. 30, 2017

(86) PCT No.: PCT/US2017/024935
§ 371 (c)(1),
(2) Date: Oct. 2, 2018

(87) PCT Pub. No.: WO2017/176540
PCT Pub. Date: Oct. 12, 2017

(65) Prior Publication Data
US 2019/0098805 A1 Mar. 28, 2019

(30) Foreign Application Priority Data
Apr. 4, 2016 (KR) .................... 10-2016-0041282

(51) Int. Cl.
*H05K 9/00* (2006.01)
*H01B 11/10* (2006.01)
(Continued)

(52) U.S. Cl.
CPC ............. *H05K 9/0098* (2013.01); *B32B 3/10* (2013.01); *B32B 5/16* (2013.01); *B32B 7/06* (2013.01);
(Continued)

(58) Field of Classification Search
CPC .......................... H05K 9/0098; H05K 9/0075
See application file for complete search history.

(56) References Cited

U.S. PATENT DOCUMENTS

| 6,534,708 B2 | 3/2003 | Ono |
| 7,342,172 B1 | 3/2008 | Wang |

(Continued)

FOREIGN PATENT DOCUMENTS

| CN | 105027355 | 11/2015 |
| CN | 205039010 | 2/2016 |

OTHER PUBLICATIONS

"Vitroperm®, Vitrolam®", Material Safety Data Sheet, 2014, No. 02, pp. 1-7.
(Continued)

*Primary Examiner* — Hung V Ngo
(74) *Attorney, Agent, or Firm* — Jonathan L. Tolstedt

(57) ABSTRACT

The present disclosure relates to a magnetic shielding tape, which is capable of shielding a high-to-low frequency of a signal transmitted through a cable in shielding of a magnetic field which flows in such a cable or is emitted therefrom, and a method for manufacturing the same. The basic magnetic shielding tape comprises: —a thin film magnetic layer including at least one metal ribbon sheet which is divided into a plurality of fine pieces by flaking process, and a gap provided between adjacent fine pieces among the plurality of fine pieces; —a cover film layer adhered to one side surface of the thin film magnetic layer through a first adhesive layer; and—a conductive layer adhered to the other side surface of the thin film magnetic layer through a second adhesive layer, wherein a size of the gap is determined according to a frequency band of the signal.

20 Claims, 5 Drawing Sheets

(51) Int. Cl.

| | | |
|---|---|---|
| *B32B 7/06* | (2019.01) | |
| *B32B 15/09* | (2006.01) | |
| *B32B 15/18* | (2006.01) | |
| *B32B 27/28* | (2006.01) | |
| *B32B 27/36* | (2006.01) | |
| *B32B 3/10* | (2006.01) | |
| *B32B 5/16* | (2006.01) | |
| *B32B 7/12* | (2006.01) | |
| *B32B 15/04* | (2006.01) | |
| *B32B 15/08* | (2006.01) | |
| *B32B 15/16* | (2006.01) | |
| *B32B 15/20* | (2006.01) | |
| *B32B 27/00* | (2006.01) | |

(52) U.S. Cl.
CPC .............. *B32B 7/12* (2013.01); *B32B 15/043* (2013.01); *B32B 15/08* (2013.01); *B32B 15/09* (2013.01); *B32B 15/16* (2013.01); *B32B 15/18* (2013.01); *B32B 15/20* (2013.01); *B32B 27/281* (2013.01); *B32B 27/36* (2013.01); *B32B 27/365* (2013.01); *H01B 11/1008* (2013.01); *H01B 11/1025* (2013.01); *H05K 9/0075* (2013.01); *B32B 27/00* (2013.01); *B32B 2250/03* (2013.01); *B32B 2264/105* (2013.01); *B32B 2307/202* (2013.01); *B32B 2307/212* (2013.01); *B32B 2307/726* (2013.01); *B32B 2307/748* (2013.01); *B32B 2405/00* (2013.01); *B32B 2457/04* (2013.01)

(56) References Cited

U.S. PATENT DOCUMENTS

| | | | |
|---|---|---|---|
| 2001/0030121 A1 | 10/2001 | Ono | |
| 2012/0236528 A1 | 9/2012 | Le | |
| 2015/0334886 A1 | 11/2015 | Jang | |
| 2015/0342099 A1 | 11/2015 | Jang | |
| 2016/0064814 A1 | 3/2016 | Jang | |
| 2016/0293295 A1 | 10/2016 | Huang | |
| 2016/0345474 A1* | 11/2016 | Oh | H04B 5/0025 |
| 2017/0182533 A1* | 6/2017 | Lee | B21B 1/22 |
| 2018/0240582 A1* | 8/2018 | Cho | H01F 10/30 |
| 2018/0254140 A1* | 9/2018 | Lee | H02J 50/12 |

OTHER PUBLICATIONS

International Search Report for PCT International Application No. PCT/US2017/024935, dated Oct. 10, 2017, 7 pages.

* cited by examiner

MAGNETIC SHIELDING TAPE FOR CABLE AND METHOD FOR MANUFACTURING THEREOF

TECHNICAL FIELD

The present disclosure relates to a magnetic shielding tape for a cable and a method for manufacturing thereof, and more particularly, to a magnetic shielding tape, which is capable of shielding a high-to-low frequency of a signal transmitted through a cable in shielding of a magnetic field which flows in such a cable or is emitted therefrom, and a method for manufacturing the same.

BACKGROUND ART

As for a communication cable transmitting a signal to a computer, various communication devices, and the like, or a power cable transmitting electric power (hereinafter, the communication cable and the power cable are collectively called as a cable), a signal transmitted through such a cable may be affected by noise including an electromagnetic field which flows from an external electronic device. In addition, a signal itself, which is transmitted through a cable, may emit noise, including an electromagnetic field to the outside, and such emitted noise may cause an effect to an external electronic device. Particularly, as a frequency of a signal transmitted through a cable is higher, such a signal may be more affected by noise which flows from the outside and further it may emit more noise to the outside.

To shield such noise, a conventional method surrounds a cable with a conductive shield layer. However, when a frequency of a signal transmitted through a cable is high, noise emitted from an inside of the cable may not be effectively shielded with only such a conductive shield layer. This is because that noise, which should be shielded, includes a lot of harmonic components as a frequency of a signal is higher. Consequently, there is a need for technology which is capable of effectively shielding the inflow and emission of noise including an electromagnetic field even when a frequency of a signal transmitted through a cable is high.

There is another conventional method for shielding noise, in which a ferrite core for filtering noise is applied to an end part of a cable. However, in the another conventional method employing such a ferrite core for filtering noise, there are difficulties in application in that a ferrite core for filtering noise, which has impedance corresponding to a characteristic of a cable, should be selected and applied to the cable, and further the ferrite core itself has a thick thickness.

Meanwhile, among technologies for shielding noise such as the electromagnetic field as described above, there may be a method using a magnetic shielding material, which contains a nano-crystalline metal ribbon having high permeability.

However, when an alternating current (AC) magnetic field is applied to the nano-crystalline metal ribbon contained in the magnetic shielding material, an eddy current may be generated on a surface of the nano-crystalline metal ribbon. The generated eddy current may cause problems including generation of heat, and the like.

To reduce an effect due to such an eddy current, there is a method of flaking the nano-crystalline metal ribbon. Through the flaking, the nano-crystalline metal ribbon may be broken up and divided into a plurality of fine pieces. When the nano-crystalline metal ribbon is divided into the plurality of fine pieces, an effect resulting from an eddy current may be reduced. This is because magnitude of an eddy current is proportional to a surface area of a position at which the eddy current is generated, and, when the nano-crystalline metal ribbon is divided into the plurality of fine pieces, a surface area of each of the fine pieces, at which the eddy current is generated, is reduced in comparison with that of the nano-crystalline metal ribbon before the flaking is performed thereon. However, when the nano-crystalline metal ribbon is divided into the plurality of fine pieces through the flaking, a crack, that is, a gap provided each between the plurality of fine pieces is significantly less than a size of each of the plurality of fine pieces, and thus adjacent fine pieces among the plurality of fine pieces may flow to come into contact with each other. When the adjacent fine pieces come into contact with each other, the surface area of the position, at which the eddy current is generated, may be increased again. This may cause an increase of the effect resulting from the eddy current.

Further, as for a conventional magnetic shielding material containing a nano-crystalline metal ribbon on which the flaking is performed, there is difficulty in securing flexibility suitable for winding a cable and the like in the form of a roll.

Therefore, when a magnetic shielding material containing a nano-crystalline metal ribbon is applied to a target including a cable and the like, technologies which are capable of preventing shielding performance of the magnetic shielding material from being degraded even when flaking is performed on the nano-crystalline metal ribbon and at the same time reducing an effect resulting from an eddy current generated at the nano-crystalline metal ribbon, and further enabling the magnetic shielding material to be easily wound on the cable and the like are required.

PRIOR ART DOCUMENT

Patent Document (Patent Document 1) U.S. Patent Application Publication No. 2001-0030121 (Oct. 18, 2001)

DISCLOSURE

Technical Problem

An object of the present disclosure is to provide technology for a shielding material for a cable, which is capable of effectively blocking the inflow and emission of noise including an electromagnetic field even when a high-frequency signal is transmitted through a cable.

Also, another object of the present disclosure is to provide technology for a shielding material for a cable, which is capable of being less affected by an eddy current generated at a metal ribbon when a signal is transmitted through a cable, and further implementing flexibility suitable for winding a cable.

However, objects of the present disclosure are not limited thereto.

Technical Solution

A magnetic shielding tape for a cable, which transmits a signal, according to one embodiment of the present disclosure includes a thin film magnetic layer including at least one metal ribbon sheet which is divided into a plurality of fine pieces by flaking process, and a gap provided between adjacent fine pieces among the plurality of fine pieces; a cover film layer adhered to one side surface of the thin film magnetic layer through a first adhesive layer; and a conductive layer adhered to the other side surface of the thin film magnetic layer through a second adhesive layer, wherein a size of the gap is determined according to a frequency band of the signal.

A magnetic shielding tape for a cable, which transmits a signal, according to another embodiment of the present disclosure includes a thin film magnetic layer including at least one or more metal ribbon sheets which is divided into a plurality of fine pieces by flaking process, and a gap provided between adjacent fine pieces among the plurality of fine pieces; a filler filled in the gap; a cover film layer adhered to one side surface of the thin film magnetic layer through a first adhesive layer; and a conductive layer adhered to the other side surface of the thin film magnetic layer through a second adhesive layer.

A method for manufacturing a magnetic shielding tape for a cable, which transmits a signal, according to one embodiment of the present disclosure includes forming a thin film magnetic layer including at least one metal ribbon sheet; adhering a cover film layer to one side surface of the thin film magnetic layer through a first adhesive layer; performing flaking on the metal ribbon sheet included in the thin film magnetic layer to which the cover film layer is adhered, thereby dividing the at least one metal ribbon sheet into a plurality of fine pieces; and adhering a conductive layer to the other side surface of the thin film magnetic layer, which includes the at least one metal ribbon sheet undergone the flaking, through a second adhesive layer, wherein the dividing includes dividing the thin film magnetic layer to provide a gap between adjacent fine pieces among the plurality of fine pieces by applying tension to the thin film magnetic layer in an extension direction of the magnetic shielding tape while the flaking is performed.

A multi-layered magnetic shielding tape according to another embodiment of the present disclosure includes a conductive layer having electrical conductivity; a magnetic layer provided on the conductive layer, and having a plurality of magnetic pieces in which a gap is provided each between the plurality of magnetic pieces, each of which has electrical conductivity, and which are spaced apart from one another by the gap, thereby being electrically isolated from one another; and an adhesive layer provided between the conductive layer and the magnetic layer and configured to adhere the conductive layer and the magnetic layer to each other, wherein, when the multi-layered magnetic shielding tape is wound around a wire, which transmits a first signal, and the conductive layer emits a second signal, the magnetic layer absorbs at least 50% of the second signal in a frequency band in a predetermined range.

A multi-layered magnetic shielding tape according to another embodiment of the present disclosure includes a conductive layer having electrical conductivity; a magnetic layer provided on the conductive layer, and having a plurality of magnetic pieces in which a gap is provided each between the plurality of magnetic pieces, each of which has electrical conductivity, and which are spaced apart from one another by the gap, thereby being electrically isolated from one another; and an adhesive layer provided between the conductive layer and the magnetic layer and configured to adhere the conductive layer and the magnetic layer to each other, wherein, when the multi-layered magnetic shielding tape is wound around a wire, which transmits a first signal, and the conductive layer emits a second signal, the magnetic layer absorbs at least 50% of the second signal in a frequency band in a predetermined range.

Advantageous Effects

In accordance with the magnetic shielding tape for a cable according to one embodiment of the present disclosure, when a metal ribbon sheet is divided into a plurality of fine pieces, a size of a gap may be determined and adjusted on the basis of a frequency of a signal transmitted through a cable. Therefore, even when the frequency of the signal transmitted through the cable is high as well as low, the inflow and emission of noise including a magnetic field and the like may be effectively blocked by adjusting the gap provided each between the plurality of fine pieces.

Also, a separate filler is filled in a gap provided each between a plurality of fine pieces configuring a metal ribbon sheet so that oxidation of each of the plurality of fine pieces, which is caused resulting from moisture penetration into the gap, may be prevented.

Additionally, a plurality of fine pieces may be fixed to and isolated from one another by a filler so that adjacent fine pieces may be prevented from coming into contact with each other due to a flow of the adjacent fine pieces.

Further, a gap provided each between a plurality of fine pieces may provide flexibility to a magnetic shielding tape for a cable. Therefore, the magnetic shielding tape for a cable according to one embodiment of the present disclosure may flexibly surround around a cable.

MODES OF THE INVENTION

Advantages, features, and implementations thereof will be apparent from embodiments which are described in detail below together with the accompanying drawings. The present disclosure, however, is not limited to embodiments to be disclosed herein and numerous other modifications can be implemented. Although the embodiments will be described with reference to a number of illustrative embodiments thereof, it should be understood that numerous other modifications and embodiments can be devised by those skilled in the art that will fall within the spirit and scope of the principles of this disclosure. The scope of the present disclosure should be construed by the appended claims, along with the full range of equivalents to which such claims are entitled.

In describing embodiments of the present disclosure, if a detailed description of a known function or configuration is determined to obscure the gist of the present disclosure, the detailed description thereof will be omitted. Further, all terms used hereinafter are defined by considering functions in embodiments of the present disclosure, and meanings thereof may be different according to a user, the intent of an operator, or custom. Therefore, the definitions of the terms used herein should follow contexts disclosed herein.

Figure 1A:
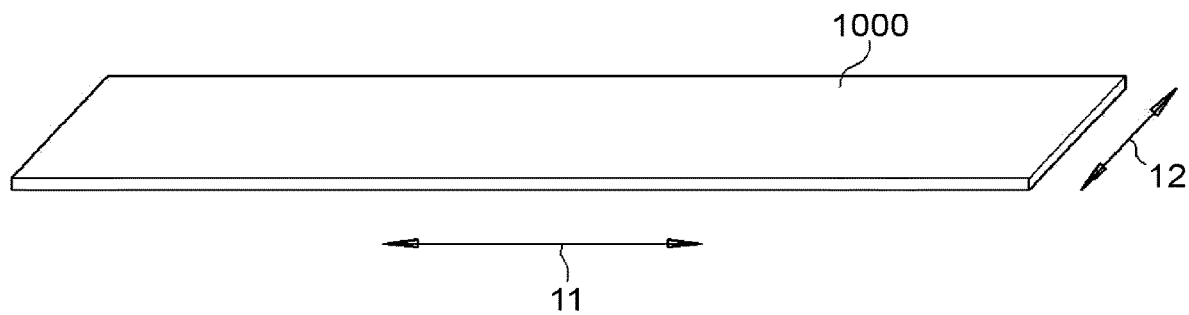
FIG. 1A is a perspective view of a magnetic shielding tape for a cable according to one embodiment of the present disclosure.
Figure 1B:
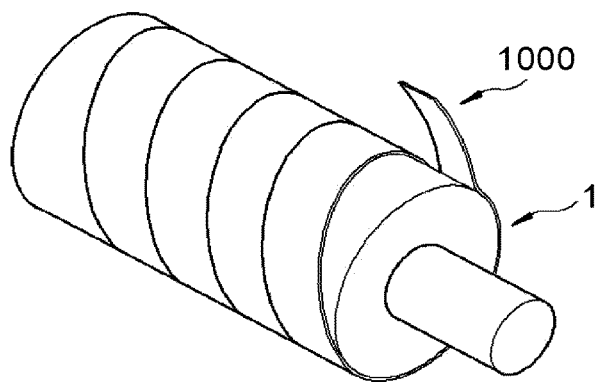
FIG. 1B is a diagram illustrating a cable to which the magnetic shielding tape for a cable according to one embodiment of the present disclosure is applied.

FIG. 1A is a perspective view of a magnetic shielding tape for a cable according to one embodiment of the present disclosure, and FIG. 1B is a diagram illustrating a cable to which the magnetic shielding tape for a cable according to one embodiment of the present disclosure is applied.

Here, a cable 1 shown in FIG. 1B may be a communication cable configured to transmit a signal to a computer, various communication devices, and the like, or a power cable configured to transmit power, but it is not limited thereto.

Referring to FIG. 1A, a magnetic shielding tape 1000 for a cable according to one embodiment of the present disclosure may be provided to have a length, for example, over 10 meters in an extension direction 11 of the magnetic shielding tape 1000 for a cable.

The magnetic shielding tape 1000 for a cable has flexibility. Therefore, as shown in FIG. 1B, the magnetic shielding tape 1000 for a cable may surround the cable 1 in the form of a roll.

The magnetic shielding tape 1000 for a cable, which surrounds the cable 1, may block a signal transmitted through the cable 1 from being affected by a magnetic field, which flows from an external electronic device, or from emitting a magnetic field to the outside, or the like.

Here, in one embodiment of the present disclosure, the magnetic shielding tape 1000 for a cable is described to be applied to the cable 1, but the spirit of the present disclosure is not limited thereto. For example, unlike as shown in FIG. 1B, the magnetic shielding tape 1000 for a cable may be also applied to a device for which shielding of a magnetic field induced by a flow of current is required, for example, a digitizer, a wireless charging device, and the like. However, it will be described below by assuming that the magnetic shielding tape 1000 for a cable is applied to a cable.

Additionally, in one embodiment of the present disclosure, the magnetic shielding tape 1000 for a cable is described to shield noise including a magnetic field, but the spirit of the present disclosure is not limited thereto. For example, the magnetic shielding tape 1000 for a cable may also shield noise including an electric field, an electromagnetic field, or the like in addition to the magnetic field.

The magnetic shielding tape 1000 for a cable according to one embodiment of the present disclosure may effectively shield a high-to-low frequency of a signal transmitted through the cable 1, and a structure of the magnetic shielding tape 1000 for a cable will be described below.

Figure 2:
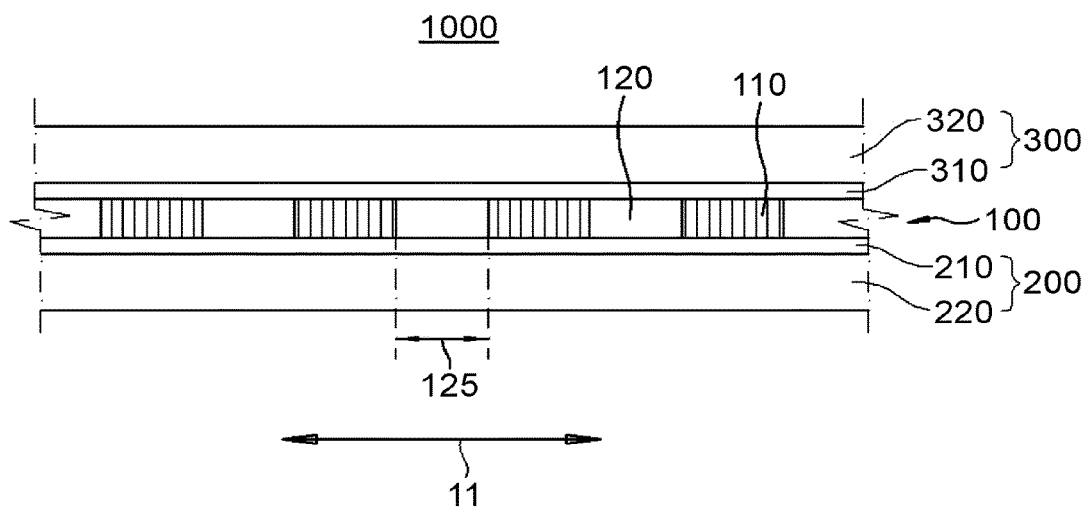
FIGS. 2 and 3 are diagrams illustrating a cross section of the magnetic shielding tape for a cable according to one embodiment of the present disclosure in an extension direction.

FIG. 2 is a diagram illustrating a cross section of the magnetic shielding tape 1000 for a cable according to one embodiment of the present disclosure in the extension direction 11.

Referring to FIG. 2, the magnetic shielding tape 1000 for a cable according to one embodiment includes a thin film magnetic layer 100, a cover film layer 220 adhered to one side surface of the thin film magnetic layer 100 through a first adhesive layer 210, and a conductive layer 320 having electrical conductivity and adhered to the other side surface of the thin film magnetic layer 100 through a second adhesive layer 310. However, the structure shown in FIG. 2 is according to one embodiment and thus the spirit of the present disclosure is not construed and limited to the structure.

The thin film magnetic layer 100 may include a metal ribbon sheet in the form of a thin film. Such a metal ribbon sheet may include a nano-crystalline alloy that is made of Fe—Si—Nb—Cu—B, or an amorphous alloy that is made of Fe—Si—B. Here, Nb may serve an effective role in uniformity of a diameter of a nano-crystalline, reduction of magnetostriction, and the like. Cu may increase corrosion resistance of an alloy, prevent coarsening of a nano-crystalline particle, and improve a magnetic characteristic including an iron loss, relative permeability, and the like of the alloy. Also, B may serve a role together with Cu in nano-crystallization of a metal ribbon. Such a metal ribbon sheet has relative permeability which is able to effectively block noise in a low-frequency band in the range of several kilohertz (kHz) to several megahertz (MHz). The nano-crystalline alloy or amorphous alloy contained in the metal ribbon sheet as described above may be formed by performing heat treatment on a metal ribbon, which contains amorphous metal, at a temperature in the range of, for example, 400 to 600 Celsius degrees. At this point, the temperature of heat treatment may be varied according to composition of the amorphous metal contained in the metal ribbon. For example, heat treatment may be preferably performed on a metal ribbon containing Fe—Si—Nb—Cu—B at a temperature in the range of 500 to 520 Celsius degrees (more preferably, 510 Celsius degrees) and thus a nano-crystalline alloy containing Fe—Si—Nb—Cu—B may be formed. Meanwhile, heat treatment may be preferably performed on a metal ribbon containing Fe—Si—B at a temperature in the range of 450 to 480 Celsius degrees (more preferably, 460 Celsius degrees) and thus an amorphous alloy containing Fe—Si—B may be formed.

The heat treatment may vary relative permeability of the metal ribbon sheet. For example, through the heat treatment, the relative permeability may begin to increase from a temperature of about 400 Celsius degrees to have a maximum value at a temperature of 600 Celsius degrees, and then may abruptly decrease from when the temperature exceeds 600 Celsius degrees. Therefore, a metal ribbon sheet having desired relative permeability may be obtained by controlling a process of heat treatment. At this point, the relative permeability, which is varied by the heat treatment, may be initial relative permeability just after the heat treatment is performed.

Also, when the heat treatment is performed, fragility of the metal ribbon sheet may be reinforced. The metal ribbon sheet, which has the reinforced fragility, may be easily divided into a plurality of fine pieces 110 when flaking is performed, as described below with reference to FIG. 5.

The metal ribbon sheet configuring the thin film magnetic layer 100 is provided in the form of a plurality of divided fine pieces 110 as shown in FIG. 2. A surface area of each of the plurality of fine pieces 110 is less than that of the metal ribbon sheet which is not yet divided into the plurality of fine pieces 110. Therefore, when an alternating current (AC) magnetic field is applied to the metal ribbon sheet, an amount of an eddy current generated on a surface of the metal ribbon sheet may be reduced in comparison with that of an eddy current generated on a surface of such a metal ribbon sheet which is not yet divided into the plurality of fine pieces 110.

The plurality of fine pieces 110 are divided and spaced apart therefrom by a gap 120. A size 125 of the gap 120 may be equal to or greater than 0.1 micrometers (um) and equal to or less than 300 um, for example. Further, such a size 125 of the gap 120 may be adjusted in the extension direction 11 of the metal ribbon sheet.

Each of the plurality of fine pieces 110 is a magnetic material having electrical conductivity, and the plurality of fine pieces 110 are electrically isolated from one another by the gap 120.

The gap 120, which is provided each between the plurality of fine pieces 110, provides flexibility to the metal ribbon sheet. Therefore, the magnetic shielding tape 1000 for a cable including such a metal ribbon sheet may be also easily wound on a cable having a small diameter, for example, 1 millimeters (mm).

At this point, the size 125 of the gap 120 may be determined by various factors or a combination thereof. For example, the size 125 of the gap 120 may be determined by considering a frequency band of a signal transmitted through the cable 1, and, when a high-frequency signal is transmitted through the cable 1, it may be determined to be a value relatively greater than that of a size 125 of the gap 120 when a low-frequency signal is transmitted through the cable 1.

Here, as the size 125 of the gap 120 is greater, a magnetic field generated when a signal of a higher frequency is transmitted through the cable 1 may be more effectively shielded.

This is because relative permeability itself of the thin film magnetic layer 100 is decreased as the size 125 of the gap 120 provided each between the plurality of fine pieces 110 is greater (this will be described below with reference to FIG. 8A), but an imaginary part of real and imaginary parts, which configure the relative permeability, is shifted to a high-frequency band (this will be described below with reference to FIG. 8B) and thus a magnetic field, which is generated when a signal of a relatively high frequency band is transmitted through cable 1, is more effectively shielded.

Additionally, the size 125 of the gap 120 may be determined by further considering a size of each of the plurality of fine pieces 110. For example, to have the same relative permeability, a size 125 of the gap 120 when a size of each of the plurality of fine pieces 110 is large may be determined to be a value relatively greater than that of a size 125 of the gap 120 when the size of each of the plurality of fine pieces 110 is small.

Also, the size 125 of the gap 120 may be determined to be a large value as an intermediate frequency in a frequency band of a signal transmitted through the cable 1 is greater.

When the size 125 of the gap 120 is determined by the various factors as described above, as it will be described in detail with reference to FIG. 5, the size 125 of the gap 120 may be formed to have the determined value at the metal ribbon sheet by adjusting a strength of tension applied in the extension direction 11 of the magnetic shielding tape 1000 for a cable, or in a proceeding direction of the thin film magnetic layer 100 while flaking is performed. For example, when a frequency of a signal being transmitted is in a high-frequency band, the size 125 of the gap 120 may be determined to shield a magnetic field of the signal having such a frequency. Further, tension is applied to the magnetic shielding tape 1000 for a cable to form a size 125 of the gap 120 with the determined size 125 thereof.

Meanwhile, the gap 120 may be provided between adjacent fine pieces among the plurality of fine pieces 110 in the extension direction 11 of the magnetic shielding tape 1000 for a cable. Additionally, the gap 120 may be further provided each between the plurality of fine pieces 110 in a width direction (see, a reference number 12 in FIG. 1A) of the magnetic shielding tape 1000 for a cable, and tension may be applied to the metal ribbon sheet in the width direction 12 of the magnetic shielding tape 1000 for a cable as well as in the extension direction 11 thereof so as to adjust a gap provided each between the plurality of fine pieces 110 in the width direction 12.

Hereinbefore, it has been described a feature of adjusting the relative permeability through the heat treatment, for example, the initial relative permeability just after the heat treatment is performed, and also a feature of adjusting the size 125 of the gap 120. The above described two features may be utilized as technologies of controlling a shielding effect against an electromagnetic field when such an electromagnetic field is generated by a signal that is transmitted through the cable 1. Moreover, in addition to such two features, technology of adjusting, for example, a width of each of the plurality of fine pieces 110 of the thin film magnetic layer 100 may be also utilized as technology of controlling a shielding effect against an electromagnetic field, and this will be described below.

More particularly, it will be described a case in which a frequency signal is currently transmitted through the cable 1, and the magnetic shielding tape 1000 for a cable is wound on the cable 1 in a state in which the cover film layer 220 faces an outward side. At this point, an electromagnetic wave is induced to the conductive layer 320 by the frequency signal being transmitted through the cable 1, and thus the conductive layer 320 emits the induced electromagnetic wave to the outside.

At this point, when at least one among a gap provided each between a plurality of fine pieces of the thin film magnetic layer 100, which is provided at the outward side of the conductive layer 320, a width of each of the plurality of fine pieces, and initial relative permeability just after heat treatment is performed on the metal ribbon sheet is adjusted, a shielding effect against the electromagnetic wave being emitted may be controlled. For example, controlling of the shielding effect may include that a frequency band of a shieldable electrical signal is adjusted and thus an amount of an electromagnetic wave, which is shielded in a corresponding frequency band, is adjusted to be equal to or greater than a specific value (that is, about 50%).

For example, when a frequency signal having a central frequency around about 85 MHz is transmitted through the cable 1, a size of a gap provided each between a plurality of fine pieces is made to have a value equal to or greater than 3 um, a width of each of the plurality of fine pieces is made to have a value equal to or less than 5 mm, initial relative permeability of the thin film magnetic layer 100 is made to have a value in the range of 1 to 5000 just after heat treatment is performed, and an absolute value of an imaginary part of the relative permeability of the thin film magnetic layer 100 is made to have a value over 100, so that an electromagnetic wave, which is induced to the conductive layer 320 by the frequency signal having the central frequency around 85 MHz, may be effectively shielded. Also, when a frequency signal having a frequency in the range of 10 kHz to 200 kHz is transmitted through the cable 1, a size of a gap provided each between a plurality of fine pieces is made to have a value equal to or greater than 0.1 um, a width of each of the plurality of fine pieces is made to have a value equal to or less than 5 mm, initial relative permeability of the thin film magnetic layer 100 is made to have a value in the range of 5000 to 80000 just after heat treatment is performed, and an absolute value of an imaginary part of the relative permeability of the thin film magnetic layer 100 is made to have a value over 100, so that an electromagnetic wave, which is induced to the conductive layer 320 by the frequency signal having the frequency in the range of 10 kHz to 200 kHz, may be also effectively shielded.

The cover film layer 220 is adhered to one side surface of the thin film magnetic layer 100 through the first adhesive layer 210. Hereinafter, a layer including the cover film layer 220 and the first adhesive layer 210 will be referred to as a cover layer 200.

The cover film layer 220 may be any one among a polyethylene terephthalate (PET) film, a polyimide (PI) film, and a polycarbonate film, for example. At this point, the first adhesive layer 210 may be an acrylic adhesive, a silicone adhesive, a hot melt adhesive, or the like, for example.

When surrounding the cable 1, such a cover film layer 220 may be removed and then used. In this case, the magnetic shielding tape 1000 for a cable is wound in a state in which the first adhesive layer 210 faces the outward side, and adjacent portions of the magnetic shielding tape 1000 for a cable are partially overlapped with each other such that the cable 1 may be more strongly surrounded due to an adhesive force of the first adhesive layer 210 when the magnetic shielding tape 1000 for a cable is wound.

The conductive layer 320 is adhered to the other side surface opposite to one side surface of the thin film magnetic layer 100 through the second adhesive layer 310. Hereinafter, a layer including the conductive layer 320 and the second adhesive layer 310 will be referred to as a bottom layer 300.

The conductive layer 320 may include aluminum or copper, for example. At this point, the second adhesive layer 310 may be an acrylic adhesive, a silicone adhesive, a hot melt adhesive, or the like, for example. The bottom layer 300 including the conductive layer 320 and the second adhesive layer 310 may be adhered to the thin film magnetic layer 100 after flaking and treatment in which tension is applied, as it will be described below with reference to FIG. 6, and then lamination treatment may be performed on the bottom layer 300 together with the thin film magnetic layer 100 and the cover layer 200.

Through such lamination treatment, some portion of the first adhesive layer 210 and the second adhesive layer 310 may permeate into the gap 120 provided each between the plurality of fine pieces 110.

Figure 3:
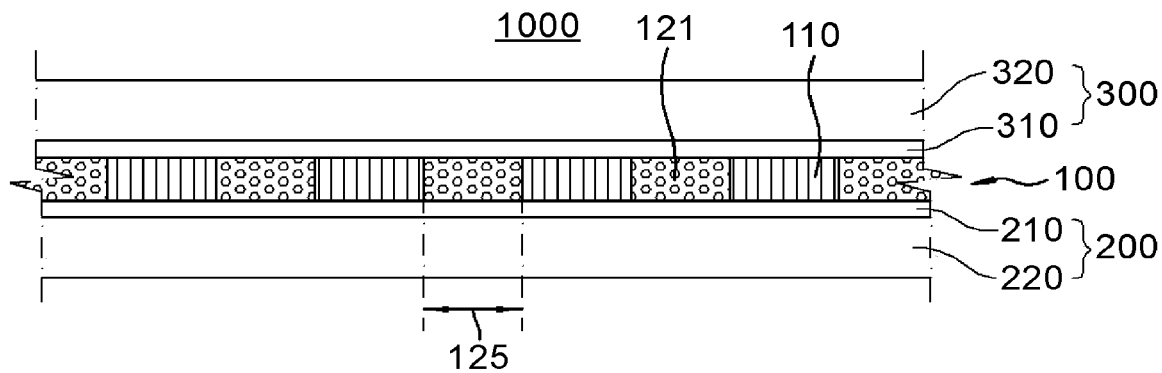

However, in another embodiment of the present disclosure, a separate filler may be filled in the gap 120 provided each between the plurality of fine pieces 110 before the bottom layer 300, that is, the conductive layer 320 is adhered. FIG. 3 is a diagram illustrating a cross section of the magnetic shielding tape 1000 for a cable, in which a separate filler 121 is filled in the gap 120 provided each between the plurality of fine pieces 110, in the extension direction. The filler 121 may be a material different from the first adhesive layer 210 and the second adhesive layer 310, and, for example, it may include any one of materials in which a phosphoric acid material or a nitric acid material is mixed with ethanol, and a transparent sol (or a choroidal solution) in which nanoparticles of $ZrO_2$, $SiO_2$, or $TiO_2$ are distributed.

Some portion of the first and second adhesive layers 210 and 310 permeating into the gap 120, or the filler 121 being filled in the gap 120 may fix and divide the plurality of fine pieces 110 to and from one another. Particularly, material contained in the filler 121 may react with the metal ribbon sheet to form a film (for example, an iron phosphate film or an iron nitrate film), and such a film may serve the above described functions (that is, fixation and inter-division). Therefore, adjacent fine pieces 110 may be prevented from coming into contact with each other due to a flow thereof so that an effect due to an eddy current may be blocked from increasing resulting from that the adjacent fine pieces 110 come into contact with each other.

Additionally, some portion of the first and second adhesive layers 210 and 310 permeating into the gap 120, or the filler 121 being filled in the gap 120 may prevent moisture from penetrating into the gap 120. Consequently, oxidation of the plurality of fine pieces 110 due to moisture penetration into the gap 120 may be prevented so that it may be possible to provide a magnetic shielding tape for a cable without degradation of shielding performance even though flaking is performed.

As described above, in the magnetic shielding tape for a cable according to one embodiment of the present disclosure, the metal ribbon sheet configuring the thin film magnetic layer is configured in the form of a plurality of divided fine pieces. Therefore, even when an AC magnetic field is applied to the metal ribbon sheet, an eddy current generated on a surface of the metal ribbon sheet may be reduced. Also, the magnetic shielding tape for a cable has more flexibility by virtue of a gap provided each between a plurality of fine pieces compared to before the metal ribbon sheet is divided, thereby being easily wound on a cable having a small diameter.

In addition, some portion of a first adhesive layer and a second adhesive layer may permeate into a gap provided each between a plurality of fine pieces 110, or a separate filler may be filled in the gap. Further, the plurality of fine pieces 110 may be fixed to and divided from one another by such a filler. Therefore, adjacent fine pieces 110 may be prevented from coming into contact with each other due to a flow thereof so that an effect due to an eddy current may be blocked from increasing resulting from that the adjacent fine pieces 110 come into contact with each other.

Additionally, some portion of an adhesive layer permeating into a gap, or a filler being filled in the gap may prevent moisture from penetrating into the gap. Consequently, oxidation of the plurality of fine pieces due to moisture penetration into the gap may be prevented so that it may be possible to provide the magnetic shielding tape for a cable without degradation of shielding performance even though flaking is performed.

Moreover, a size of the gap provided each between a plurality of fine pieces may be determined by considering a frequency band of a signal transmitted through a cable. Particularly, when a high-frequency signal is transmitted, a size of the gap may be determined to be a relatively large value compared to when a low-frequency signal is transmitted. Through the described above, even when a high-frequency signal as well as a low-frequency signal is transmitted through a cable, a magnetic field may be effectively shielded.

Meanwhile, the thin film magnetic layer 100 of FIG. 2 is shown to be configured with a single metal ribbon sheet, but it is not limited thereto, and the thin film magnetic layer 100 may be configured with at least two metal ribbon sheets which are stacked. In such a case, at least two metal ribbon sheets may be adhered to each other by an acrylic adhesive, a silicone adhesive, a hot melt adhesive, and the like, for example. When two or more metal ribbon sheets are stacked, a shielding effect may be higher than otherwise.

This may be identically applied to an embodiment shown in FIG. 3. That is, the thin film magnetic layer 100 shown in FIG. 3 may be also configured with at least two metal ribbon sheets which are stacked. In such a case, at least two metal ribbon sheets may be adhered to each other by an acrylic adhesive, a silicone adhesive, a hot melt adhesive, and the like, for example. Additionally, a metal ribbon sheet of the stacked metal ribbon sheets, which is closest to the conductive layer 320, is referred to as a first metal ribbon sheet. When the first metal ribbon sheet is divided into a plurality of fine pieces 110, the second adhesive layer 310 may permeate into a gap 120 provided each between the plurality of fine pieces 110, and otherwise, a filler 121, which is a material different from the first adhesive layer 210 or the second adhesive layer 310, may be filled in the gap 120, but it is merely illustrative.

Figure 4:
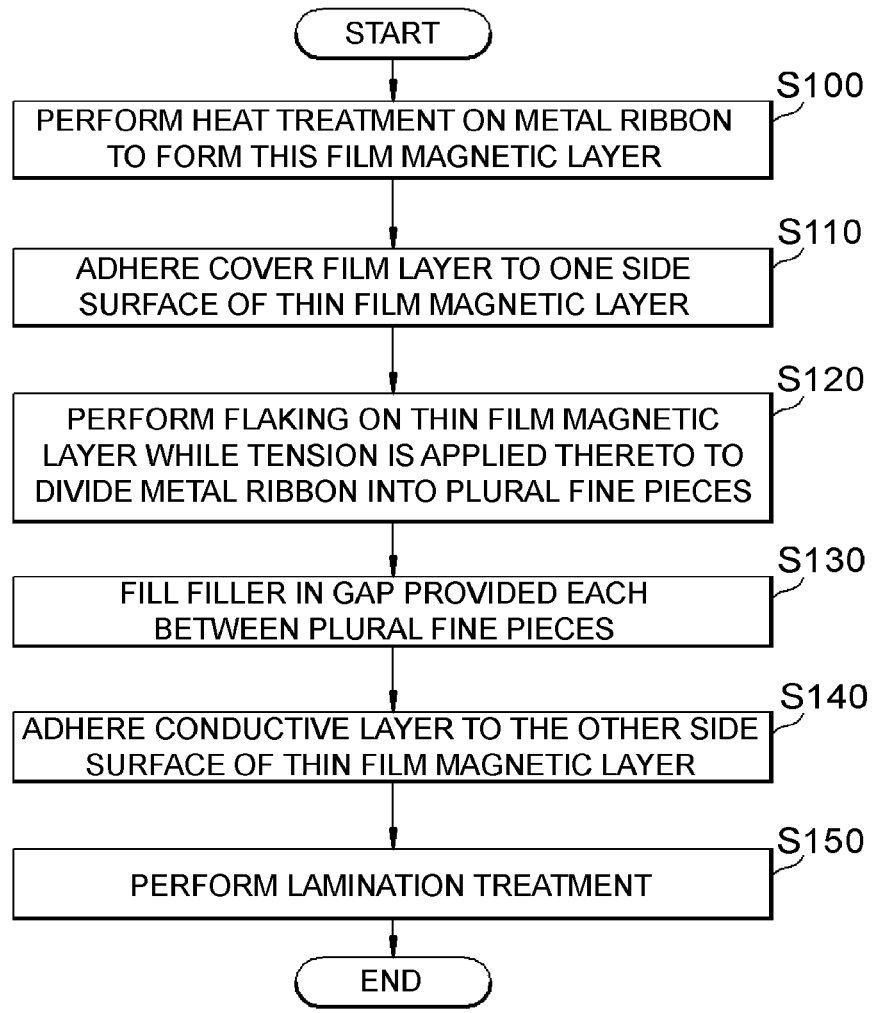
FIG. 4 is a diagram illustrating Operations in connection with a process of manufacturing the magnetic shielding tape for a cable according to one embodiment of the present disclosure.

FIG. 4 is a diagram illustrating Operations in connection with a process of manufacturing the magnetic shielding tape for a cable according to one embodiment of the present disclosure. In this case, at least one among Operations shown in FIG. 4 may not be performed according to an embodiment, Operations not shown in FIG. 4 may be additionally performed, and a performance order of Operations shown in FIG. 4 may be changed.

Referring to FIG. 4, heat treatment is performed on a metal ribbon including amorphous metal to form a thin film magnetic layer configured with a metal ribbon sheet in Operation S100. At this point, the metal ribbon sheet may include a nano-crystalline alloy or an amorphous alloy.

A temperature of the heat treatment performed on the metal ribbon is in the range of 400 to 600 Celsius degrees, and, as described above, it may be varied according to composition of the amorphous metal included in the metal ribbon. For example, heat treatment may be preferably performed on a metal ribbon containing Fe—Si—Nb—Cu—B at a temperature in the range of 500 to 520 Celsius degrees (more preferably, 510 Celsius degrees) and thus a nano-crystalline alloy containing Fe—Si—Nb—Cu—B may be formed. Meanwhile, heat treatment may be preferably performed on a metal ribbon containing Fe—Si—B at a temperature in the range of 450 to 480 Celsius degrees (more preferably, 460 Celsius degrees) and thus an amorphous alloy containing Fe—Si—B may be formed. Here, when the temperature of the heat treatment is less than 400 Celsius degrees, a nano-crystalline particle may not be sufficiently generated and thus desired relative permeability may not be obtained, and, even when the temperature of the heat treatment exceeds 700 Celsius degrees, relative permeability may be significantly lowered due to overheating treatment.

In addition, in Operation S100, at least two or more metal ribbon sheets, each of which is obtained by performing the heat treatment on the metal ribbon, may be stacked to configure the thin film magnetic layer 100. In such a case, the metal ribbon sheets may be adhered to one another by an acrylic adhesive, a silicone adhesive, a hot melt adhesive, and the like, for example.

Next, the cover film layer 220 is adhered to one side surface of the thin film magnetic layer 100 through the first adhesive layer 210 in Operation S110.

Thereafter, flaking is performed on the thin film magnetic layer 100 to which the cover film layer 220 is adhered and thus the metal ribbon sheet included in the thin film magnetic layer 100 is divided into a plurality of fine pieces 110, and further tension is applied to the thin film magnetic layer 100 in the extension direction 11 shown in FIG. 1A or in a proceeding direction when the flaking is performed, thereby providing the gap 120 provided each between the fine pieces 110 adjacent to each other in Operation S120. At this point, a size 125 of the gap 120 provided each between the plurality of fine pieces 110 may be, for example, equal to or greater than 1 um and equal to or less than 300 um, and an adjustment direction of the size 125 of the gap 120 may be the same as the extension direction 11.

Figure 5:
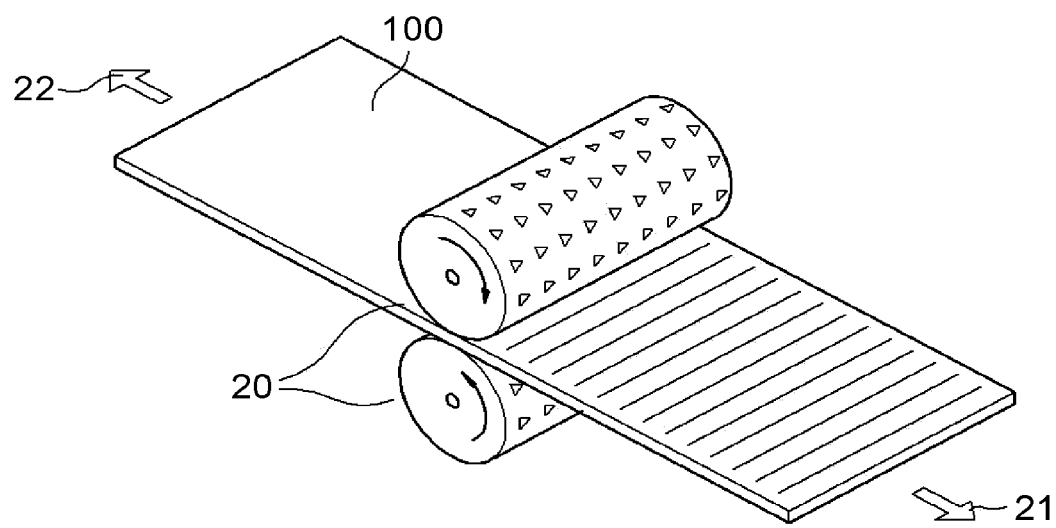
FIG. 5 is a diagram illustratively showing a process of flaking and the adjustment of a size of a gap provided each between a plurality of fine pieces of a metal ribbon sheet according to one embodiment of the present disclosure.

With reference to FIG. 5, Operation S120 will be described in more detail. Referring to FIG. 5, a pair of flaking devices 20 are provided. As shown in FIG. 5, a plurality of protruding grooves are formed on an outer circumferential surface of each of the pair of the flaking devices 20. The thin film magnetic layer 100 to which the cover film layer 220 is adhered passes between the pair of the flaking devices 20. At this point, the metal ribbon sheet of the thin film magnetic layer 100, to which the cover film layer 220 is adhered, is divided into a plurality of fine pieces 110 by the plurality of such protruding grooves.

A surface area of each of the divided fine pieces 110 is less than that of the metal ribbon sheet which is not yet divided into the plurality of fine pieces 110. Therefore, when an AC magnetic field is applied to the metal ribbon sheet, an amount of an eddy current generated on a surface of the metal ribbon sheet may be reduced.

At this point, tension is applied to the thin film magnetic layer 100 in the extension direction 11 of the magnetic shielding tape 1000 for a cable, or a proceeding direction of the thin film magnetic layer 100 while the flaking is performed. Consequently, the gap 120 is provided between adjacent fine pieces 110 among the plurality of fine pieces 110.

Figure 7:
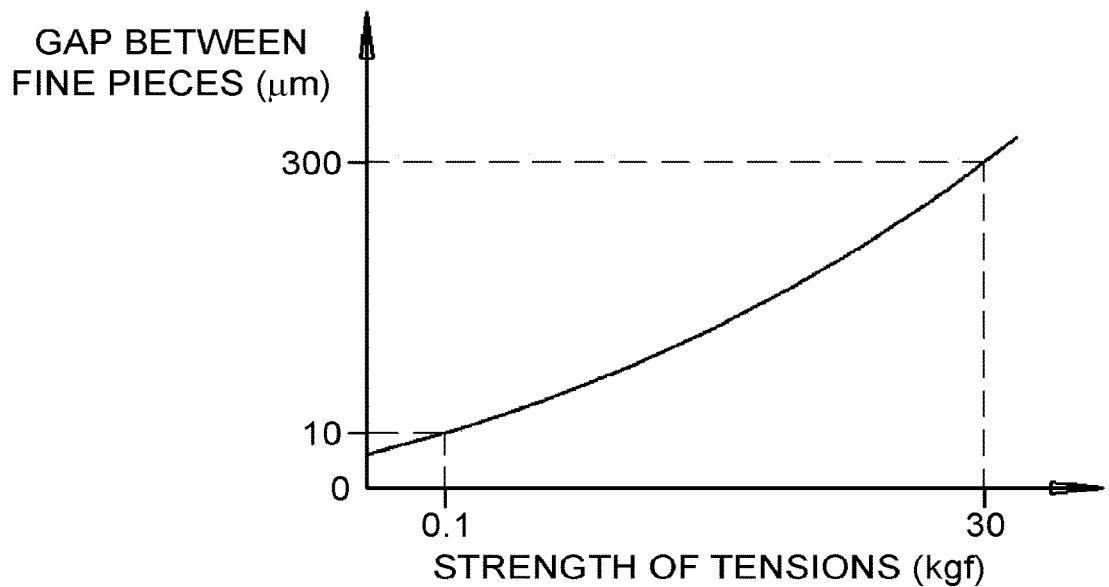
FIG. 7 is a graph illustrating a relationship between the magnitude of tension being applied and a size of a gap provided each between a plurality of fine pieces of a metal ribbon sheet in a process of manufacturing the magnetic shielding tape for a cable according to one embodiment of the present disclosure.

Here, the size 125 of the gap 120 may be adjusted (that is, determined) by a strength of tension. For example, when a strength of the tension is relatively large, the size 125 of the gap 120 may be relatively large, and, when the strength of tension is relatively small, the size 125 thereof may be relatively small. FIG. 7 is a graph illustrating a relationship between magnitude of the applied tension and the size of the gap provided each between the plurality of fine pieces 110 of a metal ribbon sheet. Referring to FIG. 7, it is shown that the size 125 of the gap 120 provided each between the plurality of fine pieces 110 is linearly proportional to the magnitude of tension. For example, when a strength of tension is 0.1 kilogram-force (kgf), the size 125 of the gap 120 may be 10 um, and, when the strength of tension is 30 kgf, the size 125 thereof may be 300 um. Here, the graph of FIG. 7 is shown on the basis of the thin film magnetic layer 100 which is configured with a single layer.

In addition, as described above, the size 125 of the gap 120 may be determined by various factors including a frequency band of a signal transmitted through the cable 1, a size of each of the plurality of fine pieces 110, an intermediate frequency in the frequency band of the signal transmitted through the cable 1, and the like, That is, according to one embodiment of the present disclosure, a size of a gap provided each between a plurality of fine pieces may be determined by considering a frequency band of a signal transmitted through a cable. Particularly, when a high-frequency signal is transmitted, a size of a gap may be determined to be a relatively large value compared to when a low-frequency signal is transmitted, and thus a magnetic field may be effectively shielded even when the high-frequency signal is transmitted through a cable.

Meanwhile, the gap 120 formed through Operation S120 may be provided each between the plurality of fine pieces 110 in the extension direction 11 of the magnetic shielding tape 1000 for a cable. Also, the gap 120 may be further provided each between the plurality of fine pieces 110 in the width direction 12 of the magnetic shielding tape 1000 for a cable, and, to this end, tension may be applied to the metal ribbon sheet in the width direction 12 thereof although not shown in FIG. 5.

Referring back to FIG. 4, after Operation S120, the filler 121 may be filled in the gap 120 provided each between the plurality of fine pieces 110 in Operation S130. At this point, the filler 121 may be a material different from the first adhesive layer 210 and the second adhesive layer 310 as described above, and it may include, for example, any one of materials in which a phosphoric acid material or a nitric acid material is mixed with ethanol, and a transparent sol (or a choroidal solution) in which nanoparticles of $ZrO_2$, $SiO_2$, or $TiO_2$ are distributed. However, Operation S130 may not be performed according to an embodiment.

Next, the conductive layer 320 is adhered to the other side surface of the thin film magnetic layer 100 through the second adhesive layer 310 in Operation S140.

More particularly, the second adhesive layer 310 is disposed between the other side surface, which is described above, of the thin film magnetic layer 100 and the conductive layer 320. The conductive layer 320 is adhered to the thin film magnetic layer 100 by virtue of such a second adhesive layer 310.

Figure 6A:
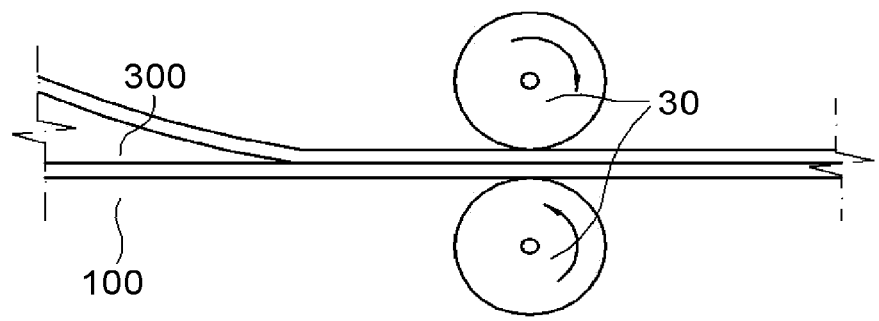
FIGS. 6A and 6B are diagrams illustratively showing a lamination treatment which is performed on the magnetic shielding tape for a cable according to one embodiment of the present disclosure.

Next, lamination treatment is performed on the bottom layer 300 including the cover layer 200, the conductive layer 320, and the second adhesive layer 310, and the thin film magnetic layer 100 in Operation S150. To describe the above in detail, it will be referred to FIGS. 6A and 6B. Referring to FIG. 6A, the thin film magnetic layer 100 to which the cover layer 200 and the bottom layer 300 are adhered passes between a pair of lamination devices 30 shown in FIG. 6A. Through such a procedure, the lamination treatment is performed with respect to the cover layer 200, the bottom layer 300, and the thin film magnetic layer 100.

Figure 6B:
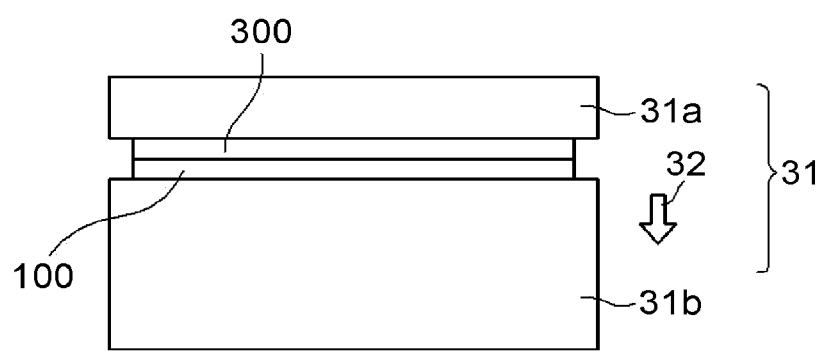

Alternatively, the lamination treatment may be performed through a lamination device different from that of FIG. 6A. For example, as shown in FIG. 6B, a lamination device 31 includes an upper pressurizing member 31a and a lower pressurizing member 31b. The thin film magnetic layer 100 may be disposed between the upper pressurizing member 31a and the lower pressurizing member 31b together with the cover layer 200 and the bottom layer 300, and then it may be compressed by relative movement of the upper pressurizing member 31a and the lower pressurizing member 31b in a direction of an arrow 32. Through such a procedure, the lamination treatment is performed with respect to the cover layer 200, the bottom layer 300, and the thin film magnetic layer 100.

Here, when Operation S130 is not performed, some portion of the first adhesive layer 210 and the second adhesive layer 310 may permeate into the gap 120 provided each between the plurality of fine pieces 110 due to Operation S150.

The plurality of fine pieces 110 may be fixed to and divided from one another by some portion of the first and second adhesive layers 210 and 310 permeating into the gap 120 when Operation S130 is not performed, or by the filler 121 being filled in the gap 120 when Operation S130 is performed. Therefore, adjacent fine pieces 110 may be prevented from coming into contact with each other due to a flow thereof so that an effect due to an eddy current may be blocked from increasing resulting from that the adjacent fine pieces 110 come into contact with each other.

Additionally, some portion of the first and second adhesive layers 210 and 310 permeating into the gap 120, or the filler 121 being filled in the gap 120 may prevent moisture from penetrating into the gap 120. Consequently, oxidation of the plurality of fine pieces 110 due to moisture penetration into the gap 120 may be prevented so that it may be possible to provide the magnetic shielding tape for a cable without degradation of shielding performance even though flaking is performed.

As described above, in the magnetic shielding tape for a cable according to one embodiment of the present disclosure, the metal ribbon sheet configuring the thin film magnetic layer is configured in the form of a plurality of divided fine pieces. Therefore, even when an AC magnetic field is applied to the metal ribbon sheet, an eddy current generated on a surface of the metal ribbon sheet may be reduced.

In addition, some portion of a first adhesive layer and a second adhesive layer may permeate into a gap provided each between a plurality of fine pieces, or a separate filler may be filled in the gap. Further, through the described above, the plurality of fine pieces may be fixed in a state of being divided from one another. Therefore, adjacent fine pieces may be prevented from coming into contact with each other due to a flow thereof so that an effect due to an eddy current may be blocked from increasing resulting from that the adjacent fine pieces come into contact with each other.

Additionally, some portion of an adhesive layer permeating into a gap, or a filler being filled in the gap may prevent moisture from penetrating into the gap. Consequently, oxidation of the plurality of fine pieces due to moisture penetration into the gap may be prevented so that it may be possible to provide the magnetic shielding tape for a cable without degradation of shielding performance even though flaking is performed.

In addition, a size of the gap provided each between the plurality of fine pieces may be determined by considering a frequency band of a signal transmitted through a cable. Particularly, when a high-frequency signal is transmitted, a size of a gap may be determined to be a relatively large value by considering the high-frequency signal compared to when a low-frequency signal is transmitted, and thus a magnetic field may be effectively shielded even when the high-frequency signal is transmitted through a cable.

Meanwhile, in one embodiment of the present disclosure, it has been described that a magnetic field, which is generated when a signal in a high-frequency band as well as in a low-frequency band is transmitted through the cable 1, may be also effectively shielded by adjusting the size 125 of the gap 120 provided each between the plurality of fine pieces 110 as described above, and hereinafter, this will be described in more detail with reference to FIGS. 8A and 8B.

Figure 8A:
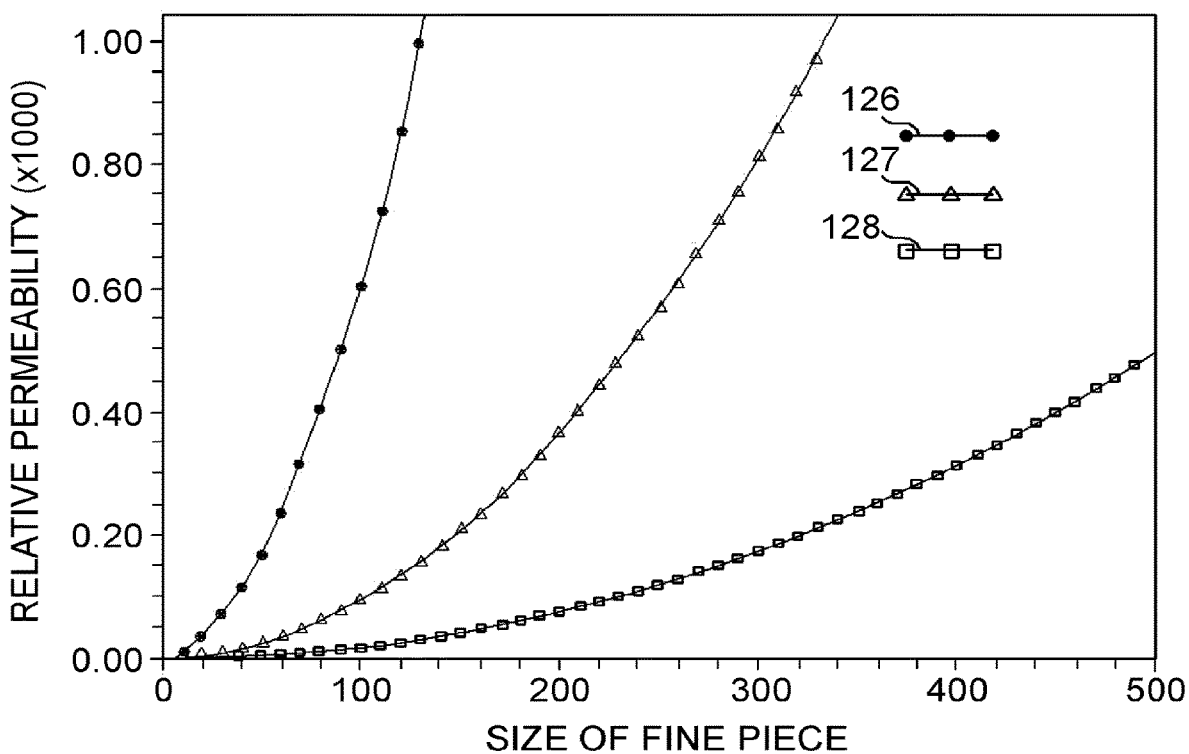
FIG. 8A is a graph illustrating a relationship among a size of each of a plurality of fine pieces of a metal ribbon sheet, which is included in the magnetic shielding tape for a cable according to one embodiment of the present disclosure, a gap between adjacent fine pieces, and relative permeability.

FIG. 8A is a graph illustratively showing a relationship among a size of each of a plurality of fine pieces of a metal ribbon sheet, which is included in the magnetic shielding tape for a cable according to one embodiment of the present disclosure, a gap between adjacent fine pieces, and relative permeability. In FIG. 8A, a size of a gap provided each between the plurality of fine pieces is smallest on a graph shown as a reference number 126, is largest on a graph shown as a reference number 128, and is medium on a graph shown as reference number 127. For example, the size of the gap is 1.0 um, 7.0 um, and 15.0 um on the graphs 126, 127, and 128, respectively. On the basis of the described above, when sizes of the plurality of fine pieces 110 are the same with one another, relative permeability itself of the thin film magnetic layer 100 is reduced as the size 125 of the gap 120 is larger. Additionally, when the sizes 125 of the gaps 120 provided each between the plurality of fine pieces 110 are the same with one another, the relative permeability itself of the thin film magnetic layer 100 is reduced as the sizes of the plurality of fine pieces 110 are smaller.

Figure 8B:
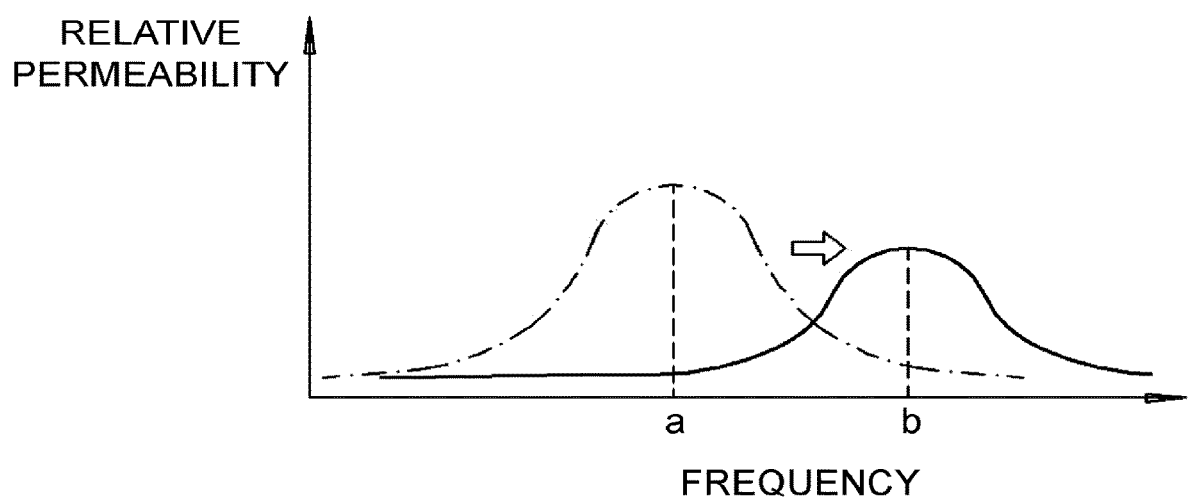
FIG. 8B is a diagram illustrating a relationship between relative permeability of a metal ribbon sheet and a frequency of a signal transmitted through a cable in application of the magnetic shielding tape for a cable according to one embodiment of the present disclosure.

However, as shown in FIG. 8B, the relative permeability itself of the thin film magnetic layer 100 is reduced as the size 125 of the gap 120 is larger, and an imaginary part of real and imaginary parts, which configure the relative permeability, is shifted from a low-frequency band a to a high-frequency band b. Consequently, the thin film magnetic layer 100 may more effectively shield a magnetic field due to a signal in a relatively high-frequency band. That is, when a refers to a maximum shielding frequency of a dotted line graph of FIG. 8B and b refers to a maximum shielding frequency of a solid line graph of FIG. 8B, a maximum shielding frequency may be controlled by adjusting a size of the gap 120 provided each between the plurality of fine pieces 110 of the thin film magnetic layer 100.

Such a maximum shielding frequency becomes to be large as a gap provided each between fine pieces is larger, a width of each of the fine pieces is smaller, and initial relative permeability, which is just after heat treatment is performed on the thin film magnetic layer 100, is smaller. A relationship among the maximum shielding frequency, the gap provided each between the fine pieces, the width of each of the fine pieces, and the initial relative permeability just after the heat treatment is performed on the thin film magnetic layer 100 is shown in Table 1 as follows, which illustrates values obtained by an experiment.

TABLE 1

| Initial Relative Permeability | Gap between Fine Pieces and Width of Fine Piece | Maximum Shielding Frequency |
|---|---|---|
| 80,000 | Gap: 0.1 um, Width: 5 mm | 36 kHz |
|  | Gap: 300 um, Width: 10 um | 3.6 MHz |
| 50,000 | Gap: 0.1 um, Width: 5 mm | 58 kHz |
|  | Gap: 300 um, Width: 10 um | 5.8 MHz |
| 10,000 | Gap: 0.1 um, Width: 5 mm | 291 kHz |
|  | Gap: 300 um, Width: 10 um | 29 MHz |
| 5,000 | Gap: 0.1 um, Width: 5 mm | 582 kHz |
|  | Gap: 300 um, Width: 10 um | 58 MHz |
| 1,000 | Gap: 0.1 um, Width: 5 mm | 2.91 MHz |
|  | Gap: 300 um, Width: 10 um | 291 MHz |
| 700 | Gap: 0.1 um, Width: 5 mm | 4.16 MHz |
|  | Gap: 300 um, Width: 10 um | 416 MHz |
| 500 | Gap: 0.1 um, Width: 5 mm | 5.82 MHz |
|  | Gap: 300 um, Width: 10 um | 582 MHz |
| 100 | Gap: 0.1 um, Width: 5 mm | 29 MHz |
|  | Gap: 300 um, Width: 10 um | 2.9 GHz |

Each of blocks or Operations may indicate a module, segment, or some of codes, which includes one or more executable instructions for performing a specific logical function(s). Also, in several alternative embodiments, it should be noticed that functions described in the blocks or Operations may occur out of order. For example, two successive blocks or Operations may be substantially executed at the same time or in reverse order according to corresponding functions as necessary.

Although the embodiments have been described with reference to a number of illustrative embodiments thereof, it should be understood that numerous other modifications and embodiments can be devised by those skilled in the art that will fall within the spirit and scope of the principles of this disclosure. The embodiments disclosed herein, therefore, are not to be taken in a sense for limiting the technical concept of the present disclosure but for explanation thereof, and the range of the technical concept is not limited to these embodiments. The scope of the present disclosure should be construed by the appended claims, along with the full range of equivalents to which such claims are entitled.

| [Description of reference numerals] | |
|---|---|
| 1: cable | 100: thin film magnetic layer |
| 220: cover film layer | 320: conductive layer |
| 1000: magnetic shielding tape for a cable | |

What is claimed is:

1. A magnetic shielding tape for a cable, which transmits a signal, comprising:
a thin film magnetic layer including at least one metal ribbon sheet which is divided into a plurality of fine pieces by flaking process, and a gap provided between adjacent fine pieces among the plurality of fine pieces;
a filler filled in the gap;
a cover film layer adhered to one side surface of the thin film magnetic layer through a first adhesive layer; and
a conductive layer adhered to the other side surface of the thin film magnetic layer through a second adhesive layer, wherein a size of the gap is determined according to a frequency band of the signal;
wherein the filler is a material other than air that is different from the first adhesive layer and the second adhesive layer.

2. The magnetic shielding tape for a cable of claim 1, wherein the size of the gap is adjustable according to a strength of tension applied to the magnetic shielding tape in an extension direction thereof while the flaking is performed.

3. The magnetic shielding tape for a cable of claim 1, wherein the size of the gap is equal to or greater than 1 micrometers (um) and equal to or less than 300 um.

4. The magnetic shielding tape for a cable of claim 1, wherein the size of the gap is determined according to a size of each of the plurality of fine pieces in addition to the frequency band of the signal.

5. The magnetic shielding tape for a cable of claim 1, wherein the size of the gap is determined to be a larger value as an intermediate frequency in the frequency band of the signal is larger.

6. The magnetic shielding tape for a cable of claim 1, wherein the at least one metal ribbon sheet includes a nano-crystalline alloy that is made of Fe—Si—Nb—Cu—B.

7. The magnetic shielding tape for a cable of claim 1, wherein the at least one metal ribbon sheet includes an amorphous alloy that is made of Fe—Si—B.

8. The magnetic shielding tape for a cable of claim 1, wherein the at least one metal ribbon sheet is obtained by performing heat treatment on a metal ribbon including amorphous metal at a temperature in a range of 400 to 600 Celsius degrees.

9. The magnetic shielding tape for a cable of claim 1, wherein the filler contains any one among a phosphoric acid material, a nitric acid material, and a sol containing nano-particles.

10. The magnetic shielding tape for a cable of claim 1, wherein the magnetic shielding tape is formed to have a length equal to or greater than 10 meters and has flexibility enabling a winding in a form of a roll.

11. The magnetic shielding tape for a cable of claim 1, wherein the thin film magnetic layer includes at least two or more metal ribbon sheets in which an adhesive layer is included between the at least two or more metal ribbon sheets.

12. A magnetic shielding tape for a cable, which transmits a signal, comprising:
a thin film magnetic layer including at least one or more metal ribbon sheets, each of which is divided into a plurality of fine pieces by flaking process, and a gap provided between adjacent fine pieces among the plurality of fine pieces;
a filler filled in the gap;
a cover film layer adhered to one side surface of the thin film magnetic layer through a first adhesive layer; and
a conductive layer adhered to the other side surface of the thin film magnetic layer through a second adhesive layer;
wherein the filler is a material other than air that is different from the first adhesive layer and the second adhesive layer.

13. The magnetic shielding tape for a cable of claim 12, wherein the at least one or more metal ribbon sheets include a nano-crystalline alloy that is made of Fe—Si—Nb—Cu—B.

14. The magnetic shielding tape for a cable of claim 12, wherein the at least one or more metal ribbon sheets include an amorphous alloy that is made of Fe—Si—B.

15. The magnetic shielding tape for a cable of claim 12, wherein the filler contains any one among a phosphoric acid material, a nitric acid material, and a sol containing nano-particles.

16. The magnetic shielding tape for a cable of claim 12, wherein the thin film magnetic layer includes at least two or more metal ribbon sheets in which an adhesive layer is included between the at least two or more metal ribbon sheets.

17. A multi-layered magnetic shielding tape comprising:
a conductive layer having electrical conductivity;
a magnetic layer provided on the conductive layer, and having a plurality of magnetic pieces in which a gap is provided each between the plurality of magnetic pieces, each of which has electrical conductivity, and which are spaced apart from one another by the gap, thereby being electrically isolated from one another;
a filler filled in the gap; and
an adhesive layer provided between the conductive layer and the magnetic layer and configured to adhere the conductive layer and the magnetic layer to each other, wherein, when the i-layered magnetic shielding tape is wound around a wire, which transmits a first signal, and the conductive layer emits a second signal, the magnetic layer absorbs at least 50% of the second signal in a frequency band of a predetermined range;
wherein the filler is a material other than air that is different from the adhesive layer.

18. A multi-layered magnetic shielding tape comprising:
a conductive layer having electrical conductivity;
a magnetic layer provided on the conductive layer, and having a plurality of magnetic pieces in which a gap is provided each between the plurality of magnetic pieces, each of which has electrical conductivity, and which are spaced apart from one another by the gap, thereby being electrically isolated from one another; and
an adhesive layer provided between the conductive layer and the magnetic layer and configured to adhere the conductive layer and the magnetic layer to each other, wherein a width of each of the plurality of magnetic pieces is equal to or greater than 10 um and equal to or less than 5 mm, and a width of the gap is equal to or greater than 0.1 um and equal to or less than 300 um, and
when a frequency, in which an imaginary part of relative permeability of the magnetic layer becomes a maximum value, refers to a maximum shielding frequency, the maximum shielding frequency is increased as the width of the gap is larger and the width of each of the plurality of magnetic pieces is smaller.

19. The multi-layered magnetic shielding tape of claim 18, wherein, when the width of the gap is greater than 3 um and a frequency signal of 85 MHz is transmitted through the conductive layer at a room temperature, an absolute value of the imaginary part of the relative permeability of the magnetic layer with respect to the frequency signal is greater than 100.

20. The multi-layered magnetic shielding tape of claim 18, wherein, when the width of the gap is greater than 0.1 um and a frequency signal in a range of 10 kHz to 200 kHz is transmitted through the conductive layer at a room temperature, an absolute value of the imaginary part of the relative permeability of the magnetic layer with respect to the frequency signal is greater than 100.

* * * * *

UNITED STATES PATENT AND TRADEMARK OFFICE
CERTIFICATE OF CORRECTION

PATENT NO. : 10,588,250 B2
APPLICATION NO. : 16/090755
DATED : March 10, 2020
INVENTOR(S) : Seong-Woo Woo et al.

It is certified that error appears in the above-identified patent and that said Letters Patent is hereby corrected as shown below:

Page 1 of 1

On the Title Page

Column 2 (item (57), Abstract)
Line 12, Delete "and-a" and insert -- and -a --, therefor.

In the Claims

Column 18
Line 9, In Claim 17, delete "i-" and insert -- multi --, therefor.

Signed and Sealed this
Twenty-ninth Day of September, 2020

Andrei Iancu
*Director of the United States Patent and Trademark Office*